(12) United States Patent
Gerber et al.

(10) Patent No.: US 6,211,673 B1
(45) Date of Patent: Apr. 3, 2001

(54) APPARATUS FOR USE IN MAGNETIC-FIELD DETECTION AND GENERATION DEVICES

(75) Inventors: Christoph Gerber, Richterswil (CH); Johannes W. Hilgenkamp, Kissing; Jochen Mannhart, Leitershofen, both of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/021,256

(22) Filed: Feb. 10, 1998

(30) Foreign Application Priority Data

Jun. 3, 1997 (EP) .................................... 97108835

(51) Int. Cl.⁷ .................................... G11B 5/127
(52) U.S. Cl. .................... 324/262; 324/260; 360/110; 360/123; 360/125
(58) Field of Search ................... 324/228, 234, 324/236, 225, 257, 258, 260, 262, 248; 250/306; 360/110, 111, 123, 124, 125, 127; 505/171

(56) References Cited

U.S. PATENT DOCUMENTS

| 4,724,318 | 2/1988 | Binnig . |
| 5,224,376 | 7/1993 | Elings et al. . |
| 5,331,491 | * 7/1994 | Hayakawa et al. .................. 360/110 |
| 5,331,589 | 7/1994 | Gambino et al. . |
| 5,491,411 | 2/1996 | Wellstood . |

OTHER PUBLICATIONS

J.R. Kirtley et al. (1995) "High–resolution Scanning SQUID Microscope" *Appl. Phys. Letts.* 66 (9): 1138–1140.
J. Clarke (1993) "Squids: Theory and Practice" *The New Superconducting Electronics* (Kluwer Academic Publisher: The Netherlands): 123–180.

* cited by examiner

Primary Examiner—Walter E. Snow
(74) Attorney, Agent, or Firm—Scully, Scott, Murphy & Presser; Jay P. Sbrollini, Esq.

(57) ABSTRACT

A magnetic-field-detecting and/or generating apparatus comprises a non-ferromagnetic tip with a longitudinal member of ferromagnetic material embedded in the tip. Further, magnetic-shield means is arranged around the tip. At the end of the longitudinal member a magnetic-field device is arranged. The same principle can be applied to read/write heads for use in magnetic-storage devices.

16 Claims, 1 Drawing Sheet

APPARATUS FOR USE IN MAGNETIC-FIELD DETECTION AND GENERATION DEVICES

BACKGROUND OF THE INVENTION

TECHNICAL FIELD

This invention refers to a magnetic-field-detecting and/or generating apparatus. More particularly, the invention relates to a scanning superconducting quantum interference device (SQUID) microscope (SSM) and a read/write head for use in magnetic storage devices.

PRIOR ART

An AFM is a device which uses a tip with a very sharp apex and low-range atomic forces to investigate the surface of a sample down to atomic dimensions. Such a device is described in U.S. Pat. No. 4,724,318 by Binnig et al. and in various other patent publications. Basically, this device has the tip mounted at a flexible cantilever which is attached to a probe holder and the vertical deflection of the tip is sensed by a detector. A commonly used operation mode of this microscope is to scan the tip over the sample while keeping the force between the tip and the surface constant by moving either the sample or the tip up and down, such that the deflection of the cantilever remains constant. In this way, the topography of the sample can be examined keeping record of the vertical motion of the probe holder. This data can be used to create 3-dimensional images of the topography of the surface. AFMs are used in many applications and embodiments and also with special tips, as disclosed for example in U.S. Pat. No. 5,331,589. Appropriate measurement devices, methods for sensing and methods for processing the resulting data are also known and disclosed in the referenced prior art and in various other publications, e.g. U.S. Pat. No. 5,224,376.

Another kind of microscope is disclosed in Appl. Phys. Lett. 66,1138 (1995) by J. R. Kirtley et al. using a scanning superconducting quantum interference device (SQUID). Such a Scanning SQUID microscope (SSM) is a very sensitive sensor for magnetic flux. A SQUID is described e.g. in NATO ASI series, Series E Applied Sciences 251 by J. Clark, H. Weinstock, W. Ralston in "The new superconducting electronics" or in other introductory textbooks about superconductivity and superconducting electronics. The SQUID itself consists of a superconducting ring interrupted by one (rf-SQUID) or two (dc-SQUID) Josephson junctions. The electrical properties of the ring (effective impedance of rf-SQUID or current-voltage characteristic of dc-SQUID) depend strongly on the magnetic flux through the superconducting ring. In order to efficiently couple the signal to be measured to the SQUID ring, often use is made of a so-called flux transformer. The flux transformer is a closed superconducting structure consisting of a pick-up loop which picks up the signal and an input coil which couples the signal to the superconducting SQUID ring. The output signal of the SQUID is measured and processed with appropriate electronic equipment.

U.S. Pat. No. 5,491,411 discloses a magnetic-flux microscope that measures the magnetic filed about a sample surface by using a thin-film SQUID as the scanning device.

Further, the SSM has been shown to be a highly valuable tool to image small magnetic fields of various types of samples such as inorganic materials, living tissues or bacteria. Though the magnetic-field sensitivity of a SSM is outstanding, its spatial resolution is up to now limited by the diameter of the superconducting ring of the SQUID or by the diameter of the pick-up loop of the flux-transformer, which at the present is 4 $\mu$m at best. In a similar way, the resolution of read/write heads for magnetic storage devices is limited because of the mechanical properties.

SUMMARY OF THE INVENTION

In accordance with the present invention, a magnetic-field-detecting and/or generating apparatus is described, comprising a tip of non-ferromagnetic material with an at least partly embedded longitudinal member of ferromagnetic material and magnetic-shield means around the tip and a magnetic-field device, e.g. a SQUID, positioned above the tip for detecting and/or generating a magnetic field. In this sense one embodiment of the invention is an improved SSM. Another embodiment is a magnetic read/write head.

The SSM arrangement has a significantly enhanced spatial resolution, which is no longer limited by the diameter of the superconducting ring of a SQUID or by the diameter of the pick-up loop of a flux-transformer. In order to optimize the resolution, the longitudinal member should have a high permeability and should preferably be made of a softferromagnetic material. In a variation of the invention, the tip comprises a longitudinal member extending from the apex of the tip along the central axis to its upper side, and protruding through the tip apex. The longitudinal member may be a narrow filament of a material having preferably a high bulk-permeability value, e.g. above $10^4$. In a further embodiment of the invention, the magnetic-shield means comprises a conductive layer, e.g. a metallic film, on the non-ferromagnetic material of the tip with a slit oriented essentially parallel to the axis of the longitudinal member to reduce the disturbing influence of magnetic fringe fields. The magnetic field should reach the ferromagnetic filament only at its apex. That shielding layer also can be made of a superconducting material. The slit serves to avoid circulating eddy currents that would diminish the coupling of the magnetic flux from the sample to the filament apex. An optimal coupling between the filament and the magnetic-field device exists when the magnetic-field lines in the filament also thread through the magnetic-field device. The term magnetic-field device is here to be understood as at least a magnetic-field-sensitive or a magnetic-field-generating element. Therefore, in an advantageous embodiment, the magnetic-field device is centrally placed over the tip, especially above the filament.

Above the filament, a superconducting pick-up loop of a SQUID can be arranged as the magnetic-field device to form a scanning SQUID microscope. The tip then has an effective apex radius that equals the radius of the filament apex, e.g. in the range of 10 nm, and is scanned across the sample. Hence, the filament will pick up the magnetic field of the sample with a spatial resolution given by the size of its apex radius and, due to the large permeability, transmits the field into the SQUID pick-up loop.

The principle also can be used for magnetic-storage devices. Therefore, the invention also proposes e.g. an induction coil as the magnetic-field device for retrieving magnetically stored data, and, furthermore, an inductive element, e.g. a coil, for generating a magnetic field usable to magnetically record data on a recording means. Hence, a write/head for use in a magnetic-storage device is proposed.

With the principle of the invention, the spatial resolution of a SSM as well as of magnetic-storage devices is significantly enhanced.

BRIEF DESCRIPTION OF THE DRAWING

Preferred embodiments of the present invention will now be described, by way of example only, with reference to the accompanying drawing, in which.

DETAILED DESCRIPTION OF THE PREFERRED EMBODIMENTS OF THE INVENTION

Figure 1:
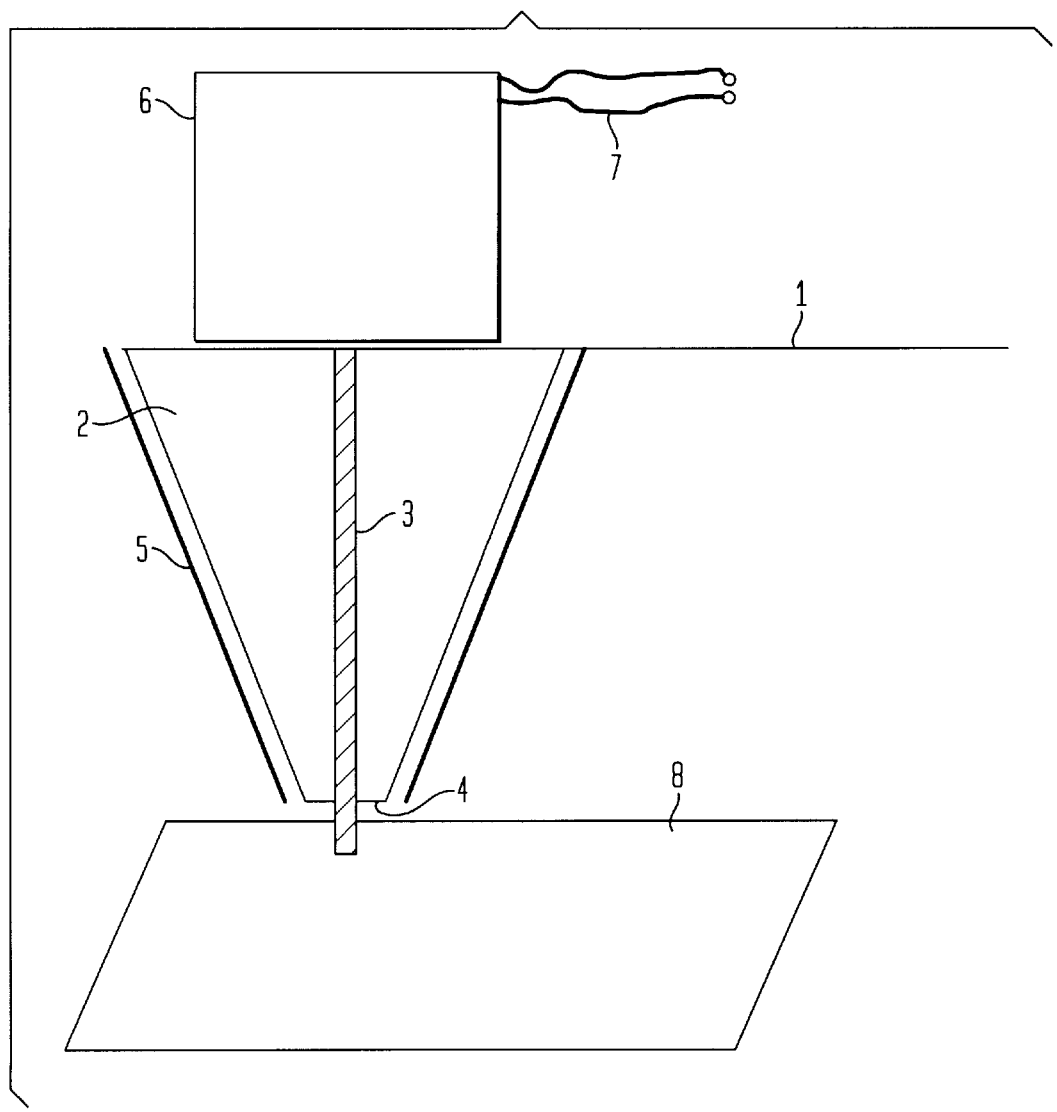
FIG. 1 is a schematic drawing of the apparatus of the present invention.

The FIGURE schematically shows the free end of a cantilever 1 of an AFM with a conical tip 2 at this free end. The tip 2 is made of a semiconductive material with a conventional silicon-manufacturing technique. Any other non-ferromagnetic material can also be used, f.i. SiN. Along the axis of the semiconductive tip 2, a longitudinal member in form of a narrow filament 3 made of a softferromagnetic material with a high permeability is embedded. The filament material is a Ni-Fe alloy with a typical (bulk) permeability value above $10^4$. Preferred suitable materials are materials known under the name Permalloy (19% Fe, 78% Ni, 3% Mn) or Mumetal (18% Fe, 75% Ni, 5% Cu, 2% Cr). The use of a Permalloy filament 3 inside the tip 2 has various advantages. This way, the width of the filament 3 can be kept very narrow which leads to a high lateral resolution of the apparatus. Further, this design maintains sufficient mechanical strength in order to perform atomic-force microscopy in combination with the magnetic imaging. The filament 3 may be fabricated by micromechanical drilling techniques, in this case by means of a focused ion beam, and subsequent thermal evaporation. The filament 3 penetrates the apex 4 of the tip 2 and can be sharpened by using standard fabrication techniques for manufacturing scanning-tunneling-microscope (STM) tips. A tip radius which is then the radius of the apex of the filament 3 seems to be possible in the range of 10 nm. The semiconductive tip 2 is coated with a film 5 that acts as a magnet-shield means. Preferred is a thin film of superconductive material. The film 5 comprises a slit (not shown) oriented parallel to the filament axis. The width of the slit in the shielding material may be as small as will be technologically possible and avoids eddy currents in the magnet-shield means 5 which would decrease the sensitivity of the apparatus.

A magnetic-field device 6, schematically depicted as a square with connecting wires 7, is arranged centric above the tip 2. In a preferred embodiment, the magnetic-field device 6 is a SQUID pick-up loop, such that a very high sensitivity is achieved. The flux transformer or at least the pick-up loop of it can be arranged on the cantilever 1, whereas the rest of the flux transformer and/or the SQUID could be positioned on the cantilever 1 or on other locations with the SQUID ring closely coupled to the input coil of the flux transformer. This arrangement represents a SSM with a spatial resolution in the tens-of-nanometer range. Manufacturing of the pick-up loop on the cantilever 1 can be accomplished by standard silicon-manufacturing techniques. Such standard technique, such as lithography, can also be employed if the tip 2 and the cantilever 1 are made of the same material. Then, only one process may suffice to manufacture the tip 2 and the cantilever 1 simultaneously. Anistropic etching could be used for creating the tip apex.

The principle can also be used for magnetic-storage devices. In this case, the magnetic-field device 6 comprises e.g. a thin-film read head or an induction coil for reading information. Like described above, the lateral resolution of the read head is improved to the order of the diameter of the apex of the filament 3. Further, in a similar way, the principle can be used to record magnetic data. In this case, the magnetic-field device 6 comprises an inductive element, e.g. a coil, generating a magnetic field, which is conducted and focused by the filament 3 to a not shown recording medium below the tip 2. The tip 2 is scanned over a sample or magnetic recording medium 8. The well-known detecting means for detecting and processing the signals as well the controlling means for controlling the movement of the tip 2 or the sample 8 are not shown; they are well known to a person skilled in the art.

The vertical position of the tip may be sensed by detecting means. This may also be used in combination with a tip-distance control arrangement which can be used for controlling the distance between the tip 2 and the sample 8. This is particularly advantageous for combining atomic-force measurement with magnetic-field easurement. Keeping the distance at a constant level results in a more precise measurement, since the magnetic field is then always measured at a predetermined distance with respect to the sample 8.

Another possibility is the use of a STM environment as driving means for the magnetic-field-detecting and/or generating apparatus. Then, no cantilever is present but the magnetic-field-detecting and/or generating apparatus is held by a directly acting driving mechanism. However, no atomic force can be used as auxiliary position control mechanism. The STM is then exclusively used as SSM and not as tunneling microscope. When the tip with the filament is attached to a cantilever, e.g. of an AFM, the whole technology connected to atomic-force microscopy can be utilized to build a SSM. Even simultaneously an image of the topography (atomic-force measurement) and of the magnetic field distribution (magnetic-flux measurement) can be obtained. Furthermore, the scanning procedure known from AFM is perfectly suited for scanning the magnetic-field-detecting and/or generating apparatus over the sample surface, because positioning precision, tip control in all dimensions and the achievable very low distance to the sample add their advantages. With this principle, a lateral resolution can be reached which lies in the order of tens of nanometers. The apparatus can also be switchable between AFM and SSM mode. Also a multitude of cantilevers with either AFM tips or tips as proposed by the invention or a mixture of both can be provided. This multitude of tips can have identical properties but also show different properties, e.g. different sensitivity, such that an array of tips with a variety of properties can be realized. The parallelism can also be used to accelerate the investigation process.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. Magnetic-field-detecting apparatus, comprising a tip (2) having an apex, said tip made of a non-ferromagnetic material (2) in which a longitudinal member (3) made of ferromagnetic material is at least partly embedded and around which magnetic-shield means (5) is arranged, and comprising a magnetic-field device (6) positioned at one end of said longitudinal member (3) for measuring a magnetic field, wherein said magnetic-shield means is tapered and narrowed at said apex for increased resolution.

2. Apparatus according to claim 1, characterized in that the longitudinal member (3) is at least essentially made of softferromagnetic material and is extending from the apex (4) of the tip (2) along its central axis and is protruding over the apex of the tip (2).

3. Apparatus according to claim 1, wherein the magnetic-shield means (5) comprises a layer conductive material.

4. Apparatus according to claim 1, characterized in that the magnetic-shield means (5) comprises superconducting material.

5. Apparatus according to claim 1, characterized in that tip (2) is located at least approximately centric below the magnetic-field device (6).

6. Apparatus according to claim 1, characterized in that the magnetic-field device (6) comprises a magnetic-field-sensitive read head, particularly for use in a magnetic-storage device.

7. Apparatus according to claim 1, characterized in that the cantilever and the tip are made from the same material, particularly a semiconductive material.

8. Apparatus according to claim 6 wherein said magnetic-field-sensitive read head comprises an induction coil.

9. Apparatus for generating a magnetic-field comprising a tip (2) having an apex, said tip made of a non-ferromagnetic material (2) in which a longitudinal member (3) made of ferromagnetic material is at least partly embedded and around which magnetic-shield means (5) is arranged, and comprising a magnetic-field device (6) positioned at one end of said longitudinal member (3) for generating a magnetic field, wherein said magnetic-shield means is tapered and narrowed at said apex for increasing resolution of an effective magnetic field generated at the apex.

10. Apparatus according to claim 6 characterized in that the logitudinal member (3) is at least essentially made of soft ferromagnetic material and is extending from the apex (4) of the tip (2) along its central axis and is protruding over the apex of the rip (2).

11. Appartus according to claim 10 wherein the magnetic-shield means (5) comprises a layer of conducting material.

12. Apparatus according to claim 10 characterized in that the magnetic-shield means (5) comprises superconducting material.

13. Apparatus according to claim 10, characterized in that tip (2) is located at least approximately centric below the magnetic-shield device (6).

14. Apparatus according to claim 10, characterized in that the magnetic field device (6) comprises an inductive element for generating a magnetic field, particularly for use to record data.

15. Apparatus according to claim 10, characterized in that the cantilever and the tip are made from the same material, particularly a semiconductive material.

16. Apparatus according to claim 15, wherein said inductive element includes a coil.

* * * * *

UNITED STATES PATENT AND TRADEMARK OFFICE
CERTIFICATE OF CORRECTION

PATENT NO.    : 6,211,673
DATED         : April 3, 2001
INVENTOR(S)   : C. Gerber et al.

It is certified that error appears in the above-identified patent and that said Letters Patent is hereby corrected as shown below:

Column 3,
Line 7, "FIGURE" should read -- figure --

Column 4, claim 13,
Line 67, "layer conductive" should read -- layer of conductive --

Column 6, claim 10,
Line 5, "rip" should read -- tip --

Signed and Sealed this

Eighth Day of January, 2002

*Attest:*

*Attesting Officer*

JAMES E. ROGAN
*Director of the United States Patent and Trademark Office*